US012731655B2

(12) United States Patent
Ayyapureddi

(10) Patent No.: US 12,731,655 B2
(45) Date of Patent: Sep. 8, 2026

(54) APPARATUSES, SYSTEMS, AND METHODS FOR PER ROW ERROR SCRUB INFORMATION REGISTERS

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 17/730,396

(22) Filed: Apr. 27, 2022

(65) Prior Publication Data

US 2023/0352112 A1 Nov. 2, 2023

(51) Int. Cl.
*G11C 29/18* (2006.01)
*G11C 29/12* (2006.01)
*G11C 29/42* (2006.01)

(52) U.S. Cl.
CPC .......... *G11C 29/42* (2013.01); *G11C 29/1201* (2013.01); *G11C 29/18* (2013.01)

(58) Field of Classification Search
CPC ......... G06F 11/00; G11C 29/42; G11C 29/00; G11C 11/401
See application file for complete search history.

(56) References Cited

U.S. PATENT DOCUMENTS 5,177,705 A 1/1993 Mcelroy et al.
5,299,164 A 3/1994 Takeuchi et al.
5,333,274 A 7/1994 Amini et al.
5,434,814 A 7/1995 Cho et al.
6,249,476 B1 6/2001 Yamazaki et al.
7,117,421 B1 10/2006 Danilak
8,891,313 B2 11/2014 Chang et al.
9,158,617 B2 * 10/2015 Cho ...................... H03M 13/09
9,195,537 B2 11/2015 Sharon et al.
9,201,728 B2 12/2015 Patapoutian et al.
(Continued)

FOREIGN PATENT DOCUMENTS

WO 2016048634 A1 3/2016
WO 2024107367 A1 5/2024
(Continued)

OTHER PUBLICATIONS

U.S. Appl. No. 17/730,381, titled "Apparatuses, Systems, and Methods for Per Row Error Scrub Information", filed Apr. 27, 2022; pp. all pages of application as filed.
(Continued)

*Primary Examiner* — Mushfique Siddique
(74) *Attorney, Agent, or Firm* — Dorsey & Whitney LLP

(57) ABSTRACT

Apparatuses, systems, and methods for per row error correct and scrub (pRECS) registers. A mode register may include a pRECS enable register, to enable a pRECS mode. When the prECS mode is enabled, pRECS information associated with each row may be collected which reflects a number of codewords stored along that row which were determined to include an error during error correct and scrub (ECS) operations. The memory may store the pRECS information in the memory array, for example, each row may store the pRECS information associated with that row. A pRECS address register may specify a location in the memory array to store the pRECS information.

21 Claims, 4 Drawing Sheets

(56) References Cited

U.S. PATENT DOCUMENTS

| | | | | |
|---|---|---|---|---|
| 9,361,960 | B2 | 6/2016 | Vogelsang | |
| 9,547,550 | B1 | 1/2017 | Thakore et al. | |
| 9,607,679 | B1 | 3/2017 | Kim et al. | |
| 9,666,291 | B2 | 5/2017 | Park | |
| 9,880,901 | B2 | 1/2018 | Zastrow | |
| 9,996,799 | B2 | 6/2018 | Bostick et al. | |
| 10,127,101 | B2* | 11/2018 | Halbert | G06F 3/0679 |
| 10,222,989 | B1 | 3/2019 | Zitlaw | |
| 10,243,590 | B1 | 3/2019 | Seshadri | |
| 10,810,079 | B2 | 10/2020 | Halbert et al. | |
| 10,817,371 | B2* | 10/2020 | Rooney | G11C 29/52 |
| 10,872,011 | B2 | 12/2020 | Bains et al. | |
| 10,929,033 | B2 | 2/2021 | Meeker et al. | |
| 10,937,517 | B1 | 3/2021 | Rich-Plotkin et al. | |
| 10,963,336 | B2 | 3/2021 | Veches | |
| 11,010,304 | B2 | 5/2021 | Kang et al. | |
| 11,074,126 | B2* | 7/2021 | Prather | G06F 11/1048 |
| 11,088,710 | B2 | 8/2021 | Lee et al. | |
| 11,177,012 | B1 | 11/2021 | Avraham et al. | |
| 11,200,961 | B1 | 12/2021 | Uribe | |
| 11,264,085 | B1 | 3/2022 | Ware et al. | |
| 11,538,515 | B2 | 12/2022 | Ji et al. | |
| 11,579,971 | B2* | 2/2023 | Ayyapureddi | G06F 11/106 |
| 11,580,038 | B2 | 2/2023 | Norman et al. | |
| 11,615,861 | B2* | 3/2023 | Kim | G11C 29/42 365/185.09 |
| 11,830,570 | B2 | 11/2023 | Laurent et al. | |
| 11,837,316 | B1 | 12/2023 | Smith et al. | |
| 12,001,707 | B2 | 6/2024 | Boehm et al. | |
| 12,014,797 | B2 | 6/2024 | Ayyapureddi | |
| 12,019,513 | B2 | 6/2024 | Ayyapureddi | |
| 12,095,474 | B1 | 9/2024 | Zhu et al. | |
| 12,204,410 | B2 | 1/2025 | Sutera et al. | |
| 12,204,770 | B2 | 1/2025 | Ayyapureddi | |
| 12,230,347 | B2 | 2/2025 | Suh et al. | |
| 12,249,393 | B2 | 3/2025 | Reohr | |
| 12,299,291 | B2 | 5/2025 | Eilert et al. | |
| 12,475,965 | B2 | 11/2025 | Smith et al. | |
| 12,488,853 | B2 | 12/2025 | Smith et al. | |
| 12,511,191 | B2 | 12/2025 | Ayyapureddi et al. | |
| 12,512,176 | B2 | 12/2025 | Smith et al. | |
| 12,524,298 | B2 | 1/2026 | Ayyapureddi | |
| 12,524,306 | B2 | 1/2026 | Ayyapureddi | |
| 12,530,261 | B2 | 1/2026 | Ayyapureddi et al. | |
| 12,536,096 | B2 | 1/2026 | Ayyapureddi | |
| 12,541,425 | B2 | 2/2026 | Ayyapureddi et al. | |
| 12,541,429 | B2 | 2/2026 | Ayyapureddi | |
| 2003/0081492 | A1 | 5/2003 | Farrell et al. | |
| 2003/0117838 | A1 | 6/2003 | Hidaka | |
| 2005/0226070 | A1 | 10/2005 | Ohsawa | |
| 2006/0233030 | A1 | 10/2006 | Choi | |
| 2008/0089129 | A1* | 4/2008 | Lee | G11C 11/5621 365/185.17 |
| 2008/0313493 | A1 | 12/2008 | Roohparvar et al. | |
| 2009/0097348 | A1 | 4/2009 | Minzoni et al. | |
| 2009/0132876 | A1 | 5/2009 | Freking et al. | |
| 2009/0168523 | A1 | 7/2009 | Shirakawa et al. | |
| 2009/0196103 | A1 | 8/2009 | Kim et al. | |
| 2010/0177582 | A1 | 7/2010 | Kim et al. | |
| 2010/0177587 | A1 | 7/2010 | Huang | |
| 2010/0290146 | A1 | 11/2010 | Lam | |
| 2011/0154158 | A1 | 6/2011 | Yurzola et al. | |
| 2012/0092940 | A1 | 4/2012 | Chang et al. | |
| 2013/0117630 | A1* | 5/2013 | Kang | G06F 11/1048 714/763 |
| 2013/0275709 | A1 | 10/2013 | Gajapathy | |
| 2014/0126300 | A1 | 5/2014 | Takahashi et al. | |
| 2015/0193464 | A1 | 7/2015 | Kwon et al. | |
| 2015/0262631 | A1 | 9/2015 | Shimizu | |
| 2016/0070507 | A1 | 3/2016 | Hoshikawa et al. | |
| 2016/0092307 | A1 | 3/2016 | Bonen et al. | |
| 2016/0125920 | A1 | 5/2016 | Kim et al. | |
| 2016/0307645 | A1* | 10/2016 | Kim | G11C 29/76 |
| 2016/0365131 | A1 | 12/2016 | Kim et al. | |
| 2017/0060681 | A1 | 3/2017 | Halbert et al. | |
| 2017/0062067 | A1 | 3/2017 | Yang et al. | |
| 2017/0091025 | A1 | 3/2017 | Ahn et al. | |
| 2017/0192843 | A1 | 7/2017 | Warnes et al. | |
| 2017/0249097 | A1 | 8/2017 | Eguchi | |
| 2017/0269992 | A1 | 9/2017 | Bandic et al. | |
| 2017/0285990 | A1 | 10/2017 | Chen et al. | |
| 2017/0286213 | A1 | 10/2017 | Li | |
| 2017/0344423 | A1 | 11/2017 | Hsiao et al. | |
| 2018/0025760 | A1 | 1/2018 | Mazumder et al. | |
| 2018/0121283 | A1 | 5/2018 | Plants | |
| 2018/0150350 | A1 | 5/2018 | Cha et al. | |
| 2018/0301203 | A1 | 10/2018 | Kim | |
| 2019/0066816 | A1 | 2/2019 | Dono | |
| 2019/0073261 | A1* | 3/2019 | Halbert | G06F 3/0679 |
| 2019/0103154 | A1 | 4/2019 | Cox et al. | |
| 2019/0197171 | A1 | 6/2019 | Tiwari et al. | |
| 2019/0206478 | A1 | 7/2019 | Jun | |
| 2019/0362792 | A1 | 11/2019 | Oh et al. | |
| 2019/0369893 | A1 | 12/2019 | Ross | |
| 2019/0371403 | A1 | 12/2019 | Maejima | |
| 2020/0019462 | A1* | 1/2020 | Prather | G06F 11/1068 |
| 2020/0051616 | A1 | 2/2020 | Cho | |
| 2020/0104205 | A1 | 4/2020 | Noguchi et al. | |
| 2020/0104208 | A1 | 4/2020 | Heo et al. | |
| 2020/0194050 | A1 | 6/2020 | Akamatsu | |
| 2020/0226039 | A1 | 7/2020 | Lee | |
| 2020/0321060 | A1 | 10/2020 | Lang et al. | |
| 2020/0373941 | A1 | 11/2020 | Latorre et al. | |
| 2021/0011645 | A1 | 1/2021 | Martinelli et al. | |
| 2021/0012817 | A1 | 1/2021 | Laurent et al. | |
| 2021/0012849 | A1 | 1/2021 | Kim et al. | |
| 2021/0057003 | A1 | 2/2021 | Prather et al. | |
| 2021/0064119 | A1 | 3/2021 | Mirichigni et al. | |
| 2021/0064282 | A1 | 3/2021 | He et al. | |
| 2021/0064461 | A1 | 3/2021 | Veches | |
| 2021/0064467 | A1 | 3/2021 | Buerkle et al. | |
| 2021/0083687 | A1 | 3/2021 | Lee et al. | |
| 2021/0142848 | A1* | 5/2021 | Lim | G11C 29/81 |
| 2021/0142860 | A1* | 5/2021 | Song | G11C 29/44 |
| 2021/0200630 | A1 | 7/2021 | Ishikawa et al. | |
| 2021/0208967 | A1 | 7/2021 | Cha et al. | |
| 2021/0224155 | A1 | 7/2021 | Bains et al. | |
| 2021/0247910 | A1 | 8/2021 | Kim et al. | |
| 2021/0272627 | A1 | 9/2021 | Lee | |
| 2021/0294692 | A1 | 9/2021 | Chen | |
| 2021/0311821 | A1 | 10/2021 | Ryu et al. | |
| 2021/0311822 | A1 | 10/2021 | Jannusch et al. | |
| 2021/0311830 | A1 | 10/2021 | Lee | |
| 2021/0357287 | A1 | 11/2021 | Kim et al. | |
| 2021/0358559 | A1 | 11/2021 | Suh et al. | |
| 2021/0365316 | A1 | 11/2021 | Nale et al. | |
| 2021/0406123 | A1 | 12/2021 | Nakanishi et al. | |
| 2022/0027090 | A1 | 1/2022 | Kwon et al. | |
| 2022/0035529 | A1 | 2/2022 | Bennett | |
| 2022/0084565 | A1 | 3/2022 | Prather et al. | |
| 2022/0091938 | A1 | 3/2022 | Buerkle et al. | |
| 2022/0129196 | A1 | 4/2022 | Roberts et al. | |
| 2022/0138065 | A1 | 5/2022 | Secatch et al. | |
| 2022/0197739 | A1* | 6/2022 | Ryu | G06F 11/106 |
| 2022/0261310 | A1 | 8/2022 | Ishikawa et al. | |
| 2022/0334917 | A1 | 10/2022 | Veches | |
| 2022/0337271 | A1 | 10/2022 | Hanna | |
| 2022/0365692 | A1 | 11/2022 | Vankamamidi et al. | |
| 2022/0398042 | A1 | 12/2022 | Song et al. | |
| 2022/0415398 | A1 | 12/2022 | Lien et al. | |
| 2023/0009642 | A1 | 1/2023 | Eilert et al. | |
| 2023/0146549 | A1 | 5/2023 | Lien et al. | |
| 2023/0161665 | A1 | 5/2023 | Choi et al. | |
| 2023/0185665 | A1* | 6/2023 | Ayyapureddi | G06F 11/106 714/764 |
| 2023/0223096 | A1 | 7/2023 | Bains et al. | |
| 2023/0236747 | A1 | 7/2023 | Curewitz et al. | |
| 2023/0289072 | A1 | 9/2023 | Cho et al. | |
| 2023/0298682 | A1 | 9/2023 | Suh et al. | |
| 2023/0315571 | A1 | 10/2023 | Sutera et al. | |
| 2023/0350581 | A1 | 11/2023 | Ayyapureddi | |
| 2023/0350748 | A1 | 11/2023 | Ayyapureddi | |
| 2023/0352064 | A1 | 11/2023 | Ayyapureddi | |
| 2024/0004754 | A1 | 1/2024 | Veches | |

(56) References Cited

U.S. PATENT DOCUMENTS

| | | | |
|---|---|---|---|
| 2024/0029781 | A1 | 1/2024 | Schreck et al. |
| 2024/0079074 | A1 | 3/2024 | Bak et al. |
| 2024/0086520 | A1 | 3/2024 | Kaplan et al. |
| 2024/0096404 | A1 | 3/2024 | Cho et al. |
| 2024/0126438 | A1 | 4/2024 | Suh et al. |
| 2024/0160351 | A1 | 5/2024 | Ayyapureddi et al. |
| 2024/0160524 | A1 | 5/2024 | Ayyapureddi et al. |
| 2024/0160527 | A1 | 5/2024 | Ayyapureddi et al. |
| 2024/0161855 | A1 | 5/2024 | Smith et al. |
| 2024/0161856 | A1 | 5/2024 | Smith et al. |
| 2024/0161859 | A1 | 5/2024 | Ayyapureddi et al. |
| 2024/0170088 | A1 | 5/2024 | Smith et al. |
| 2024/0176699 | A1 | 5/2024 | Ayyapureddi et al. |
| 2024/0177794 | A1 | 5/2024 | Vogelsang |
| 2024/0220142 | A1 | 7/2024 | Park |
| 2024/0220149 | A1 | 7/2024 | Kim et al. |
| 2024/0248796 | A1 | 7/2024 | Ayyapureddi |
| 2024/0256380 | A1 | 8/2024 | Ayyapureddi |
| 2024/0256382 | A1 | 8/2024 | Ayyapureddi |
| 2024/0272979 | A1 | 8/2024 | Ayyapureddi |
| 2024/0272984 | A1 | 8/2024 | Ayyapureddi |
| 2024/0273014 | A1 | 8/2024 | Ayyapureddi |
| 2024/0274223 | A1 | 8/2024 | Ayyapureddi |
| 2024/0281327 | A1 | 8/2024 | Ayyapureddi et al. |
| 2024/0289266 | A1 | 8/2024 | Ayyapureddi |
| 2024/0321328 | A1 | 9/2024 | Ayyapureddi |
| 2024/0377952 | A1 | 11/2024 | Song et al. |
| 2024/0394178 | A1 | 11/2024 | Partsch |
| 2024/0419538 | A1 | 12/2024 | Huang et al. |
| 2025/0077103 | A1 | 3/2025 | Ayyapureddi |
| 2025/0077424 | A1 | 3/2025 | Ayyapureddi |
| 2025/0078906 | A1 | 3/2025 | Kim et al. |
| 2025/0078949 | A1 | 3/2025 | Ayyapureddi |
| 2025/0078950 | A1 | 3/2025 | Ayyapureddi |
| 2025/0110643 | A1 | 4/2025 | Ayyapureddi |
| 2025/0110825 | A1 | 4/2025 | Ayyapureddi |
| 2025/0110830 | A1 | 4/2025 | Ayyapureddi |
| 2025/0111887 | A1 | 4/2025 | Ayyapureddi |
| 2025/0112643 | A1 | 4/2025 | Ayyapureddi |
| 2025/0123924 | A1 | 4/2025 | Ayyapureddi et al. |
| 2025/0138940 | A1 | 5/2025 | Cho et al. |
| 2025/0156087 | A1 | 5/2025 | Ayyapureddi |
| 2025/0165160 | A1 | 5/2025 | Eilert et al. |
| 2026/0044413 | A1 | 2/2026 | Ayyapureddi et al. |
| 2026/0051358 | A1 | 2/2026 | Smith et al. |

FOREIGN PATENT DOCUMENTS

| | | | |
|---|---|---|---|
| WO | 2024107503 | A1 | 5/2024 |
| WO | 2024107504 | A1 | 5/2024 |
| WO | 2024167711 | A1 | 8/2024 |

OTHER PUBLICATIONS

U.S. Appl. No. 17/731,024, titled "Apparatuses, Systems, and Methods for Managing Metadata Storage at a Memory", filed Apr. 27, 2022; pp. all pages of the application as filed.

U.S. Appl. No. 17/730,992 titled "Mode Register for Blocking Direct Access to Meta Data" filed Apr. 27, 2022, pp. all pages of application as filed.

U.S. Appl. No. 17/730,992 titled "Mode Register for Blocking Direct Access to Meta Data" filed Apr. 27, 2022, all pages of the application as filed.

PCT Application No. PCT/US24/39192 titled "Apparatuses and Methods for Scalable 1-PASS Error Correction Code Operations" filed Jul. 23, 2024, pp. all pages of the application as filed.

PCT Application No. PCT/US24/39195 titled "Apparatuses and Methods for Half-Page Modes of Memory Devices" filed Jul. 23, 2024, pp. all pages of the application as filed.

PCT Application No. PCT/US24/39231 titled "Apparatuses and Methods for Granular Single-Pass Metadata Access Operations" filed Jul. 24, 2024, pp. all pages of the application as filed.

U.S. Appl. No. 19/025,934, titled "Apparatuses, Systems, and Methods for Managing Metadata Security and Access" filed Jan. 16, 2025, pp. all pages of application as filed.

Chen et al., "CATCAM: Constant-time Alteration Ternary CAM with Scalable In-Memory Architecture"; 2020 53rd Annual IEEE/ACM International Symposium on Microarchitecture (MICRO), Athens, Green; Oct. 17-21, 2020; pp. 342-355,.

J. F. Philippe Marchand "An Alterable Programmable Logic Array"; IEEE Journal of Solid-State Circuits, vol. sc-20, No. 5, Oct. 1985; pp. 1061-1066.

Lumenci Team "High Bandwidth Memory (HBM3)" https://lumenci.com/blogs/high-bandwidth-memory; Editorial Team at Lumenci, Jul. 14, 2022; pp. 1-3.

U.S. Appl. No. 18/625,539, titled "Apparatuses, Systems, and Methods for Per Row Error Scrub Information" filed Apr. 3, 2024, pp. all pages of application as filed.

U.S. Appl. No. 18/424,282 titled "Apparatuses and Methods for Bounded Fault Compliant Metadata Storage" filed Jan. 26, 2024; pp. all pages of application as filed.

U.S. Appl. No. 18/424,342 titled "Apparatuses and Methods for Bounded Fault Compliant Metadata Storage" filed Jan. 26, 2024; pp. all pages of application as filed.

U.S. Appl. No. 18/430,381, titled "Apparatuses, Systems, and Methods for Storing Memory Metadata", filed Feb. 1, 2024; pp. all pages of application as filed.

U.S. Appl. No. 18/430,406, titled "Apparatuses, Systems, and Methods for Storing Memory Metadata", filed Feb. 1, 2024; pp. all pages of application as filed.

U.S. Appl. No. 18/431,232, titled "Apparatuses, Systems, and Methods for Storing Memory Metadata", filed Feb. 2, 2024; pp. all pages of application as filed.

U.S. Appl. No. 18/431,306, titled "Apparatuses, Systems, and Methods for Storing Memory Metadata", filed Feb. 2, 2024; pp. all pages of application as filed.

U.S. Appl. No. 18/441,775 titled "Apparatuses and Methods for Settings for Adjustable Write Timing" filed Feb. 14, 2024, pp. all pages of the application as filed.

U.S. Appl. No. 18/441,830 titled "Apparatuses, Systems, and Methods for Storing and Accessing Memory Metadata and Error Correction Code Data" filed Feb. 14, 2024, pp. all pages of the application as filed.

U.S. Appl. No. 18/504,215 titled "Apparatuses and Methods for Enhanced Metadata Support" filed Nov. 8, 2023; pp. all pages of application as filed.

U.S. Appl. No. 18/504,234 titled "Apparatuses and Methods for Enhanced Metadata Support" filed Nov. 8, 2023; pp. all pages of application as filed.

U.S. Appl. No. 18/504,302 titled "Apparatuses and Methods for Configurable Ecc Modes" filed Nov. 8, 2023; pp. all pages of application as filed.

U.S. Appl. No. 18/504,316 titled "Apparatuses and Methods for Configurable ECC Modes" filed Nov. 8, 2023; all pages of application as filed.

U.S. Appl. No. 18/504,324 titled "Apparatuses and Methods for Single-Pass Access of ECC Information, Metadata Information or Combinations Thereof" filed Nov. 8, 2023, all pages of application as filed.

U.S. Appl. No. 18/504,342 titled "Apparatuses and Methods for Single-Pass Access of ECC Information, Metadata Information or Combinations Thereof" filed Nov. 8, 2023; pp. all pages of application as filed.

U.S. Appl. No. 18/504,353 titled "Apparatuses and Methods for Separate Write Enable for Single-Pass Accessof Data, Metadata, and Parity Information" filed Nov. 8, 2023; pp. all pages of application as filed.

U.S. Appl. No. 18/504,362 titled "Apparatuses and Methods for Separate Write Enable for Single-Pass Access of Data, Metadata, and Parity Information" filed Nov. 8, 2023; pp. all pages of application as filed.

U.S. Appl. No. 18/734,189, titled "Apparatuses, Systems, and Methods for Managing Metadata Storage at a Memory" filed Jun. 5, 2024, pp. all pages of application as filed.

(56) References Cited

OTHER PUBLICATIONS

U.S. Appl. No. 18/743,994 titled "Apparatuses and Methods for Shared Codeword in 2-PASS Access Operations" filed Jun. 14, 2024, pp. all pages of the application as filed.
U.S. Appl. No. 18/745,577 titled "Apparatuses and Methods for Half-Page Modes of Memory Devices" filed Jun. 17, 2024, pp. all pages of the application as filed.
U.S. Appl. No. 18/745,843 titled "Apparatuses and Methods for Half-Page Modes of Memory Devices" filed Jun. 17, 2024, pp. all pages of the application as filed.
U.S. Appl. No. 18/745,877 titled "Apparatuses and Methods for Half-Page Modes of Memory Devices" filed Jun. 17, 2024, pp. all pages of the application as filed.
U.S. Appl. No. 18/745,894 titled "Apparatuses and Methods for Half-Page Modes of Memory Devices" filed Jun. 17, 2024, pp. all pages of the application as filed.
U.S. Appl. No. 18/747,658, titled "Apparatuses and Methods for Bounded Fault Compliant Metadata Storage" filed, pp. all pages of application as filed.
U.S. Appl. No. 18/747,676, titled "Apparatuses and Methods for Alternate Memory Die Metadata Storage", filed Jun. 19, 2024, pp. all pages of application as filed.
U.S. Appl. No. 18/747,696, titled "Apparatuses and Methods for Scalable 1-PASS Error Correction Code Operations", filed Jun. 19, 2024, pp. all pages of application as filed.
U.S. Appl. No. 18/747,712, titled "Apparatuses and Methods for Granular Single-Pass Metadata Access Operations" filed Jun. 19, 2024, pp. all pages of application as filed.
U.S. Appl. No. 18/747,635, titled "Apparatuses and Methods for Read/Modify/Writemetadata Access Operations" filed Jun. 19, 2024, pp. all pages of application as filed.
U.S. Appl. No. 19/360,159 titled "Apparatuses and Methods for Enhanced Metadata Support" filed Oct. 16, 2025; pp. all pages of the application as filed.
U.S. Appl. No. 19/366,908 titled "Apparatuses and Methods for Configurable Ecc Modes", filed Oct. 23, 2025; pp. all pages of application as filed.
U.S. Appl. No. 19/376,027 titled "Apparatuses and Methods for Single-Pass Access of Ecc Information, Metadata Information or Combinations Thereof", filed Oct. 31, 2025; pp. all pages of application as filed.
U.S. Appl. No. 19/441,648, titled "Apparatuses, Systems, and Methods for Storing and Accessing Memory Metadata and Error Correction Code Data" filed Jan. 6, 2026; pp. all pages of application as filed.
U.S. Appl. No. 19/543,150, titled "Apparatuses, Systems, and Methods for Storing Memory Metadata", filed Feb. 18, 2026, pp. all pages of application as filed.
U.S. Appl. No. 19/431,541, titled "Apparatuses And Methods For Bounded Fault Compliant Metadata Storage" filed Dec. 23, 2025, pp. all pages of application as filed.
U.S. Appl. No. 19/435,124 titled "Apparatuses, Systems, and Methods for Storing Memory Metadata", filed Dec. 29, 2025; pp. all page of the application as filed.

* cited by examiner

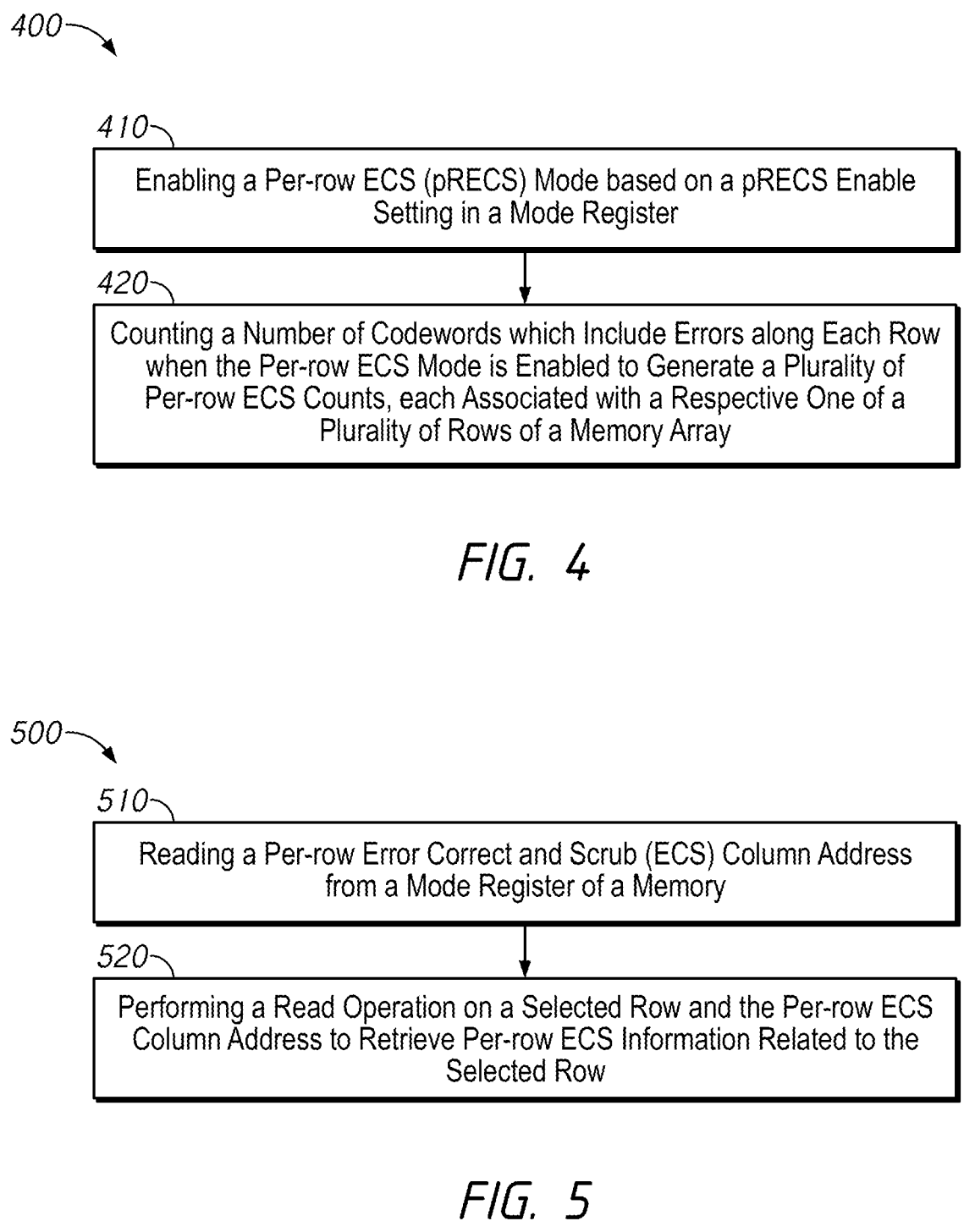

400

410 Enabling a Per-row ECS (pRECS) Mode based on a pRECS Enable Setting in a Mode Register 420 Counting a Number of Codewords which Include Errors along Each Row when the Per-row ECS Mode is Enabled to Generate a Plurality of Per-row ECS Counts, each Associated with a Respective One of a Plurality of Rows of a Memory Array

510 Reading a Per-row Error Correct and Scrub (ECS) Column Address from a Mode Register of a Memory 520 Performing a Read Operation on a Selected Row and the Per-row ECS Column Address to Retrieve Per-row ECS Information Related to the Selected Row

FIG. 5

APPARATUSES, SYSTEMS, AND METHODS FOR PER ROW ERROR SCRUB INFORMATION REGISTERS

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors. The memory device may periodically use the error correction circuits to repair errors in information stored within the memory array by scanning every memory cell of the memory array.

BRIEF DESCRIPTION OF THE DRAWINGS

FIG. 4 is a flow chart of a method according to some embodiments of the present disclosure.

FIG. 5 is a flow chart of a method according to some embodiments of the present disclosure.

DETAILED DESCRIPTION

Figure 1:
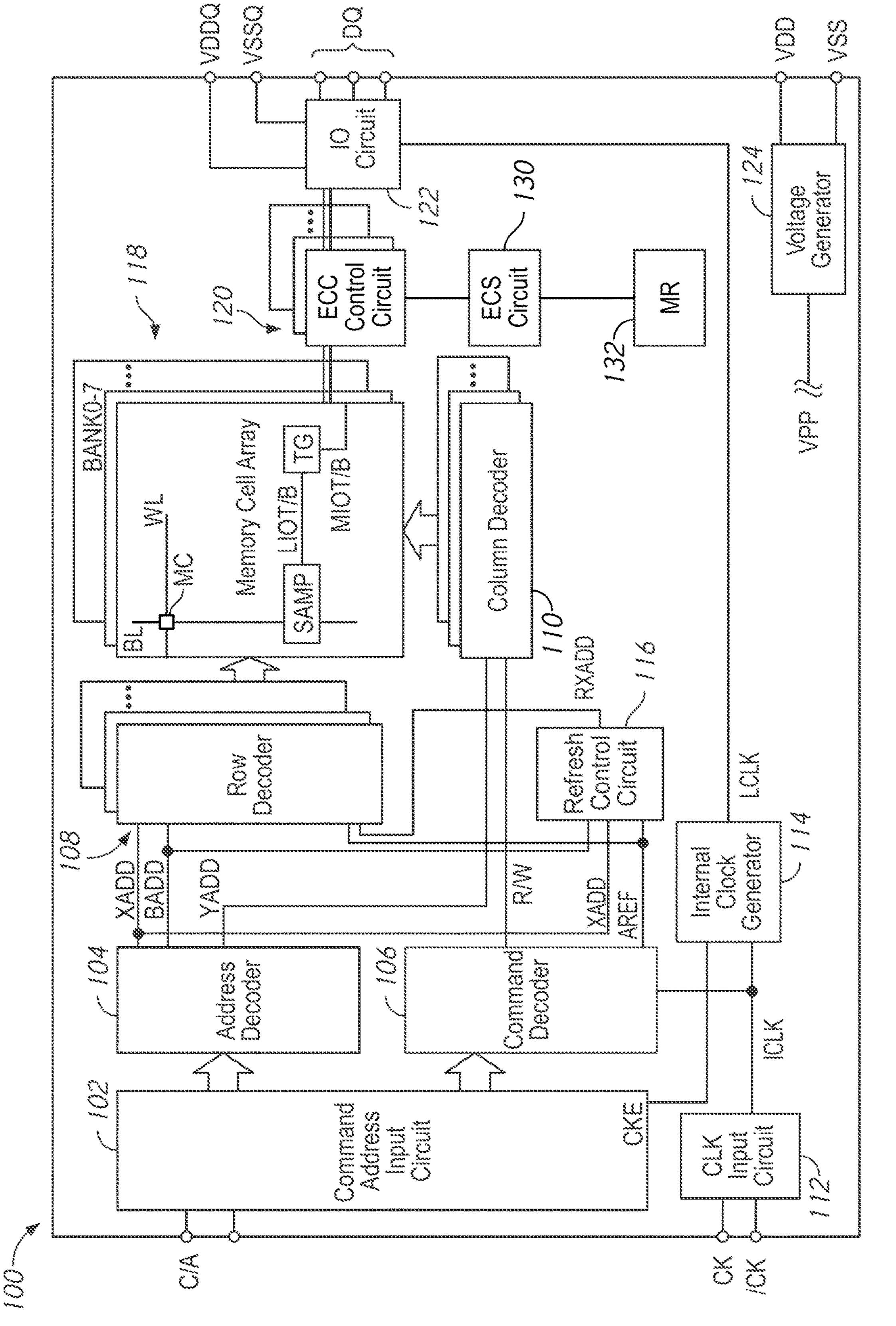
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include one or more codewords, each of which includes M data bits and K parity bits, which may be used to correct up to one of the M data bits or one of the K parity bits. During a write operation the parity bits may be generated by an error correction code (ECC) circuit based on the data written to the memory cells of the row. During a read operation the error correction code circuit may use the parity bits to determine if the read data bits are correct, and may correct any errors which are found in the data as it is being provided off the memory device.

The ECC circuit may identify errors in read data and correct the read data before it is provided to data terminals of the memory device. However, the error may remain in the codeword stored in the memory array. The device may perform error check and scrub (ECS) operations to remedy this. In an ECS operation, the address of each codeword of the memory array may be accessed one at a time. The codeword from the current address is read out, an error, if present, is corrected by the ECC circuit, and then the corrected codeword is written back to the memory array. The memory performs an ECS cycle by performing ECS operations on each codeword of the memory by working through a sequence of every codeword address.

During an ECS cycle, the memory may collect information about the number of codewords which contained an error. For example, the memory may report a total number of codewords with errors and/or the address of the row which contains the most codeword errors. However, it may be useful to collect more granular information about the detected codeword errors.

The present disclosure is directed to apparatuses, systems, and methods for per row scrub information registers. The memory may collect per-row ECS (pRECS) information about each row. For example, over the course a scrub cycle, the memory may generate a number for each row, where the number is the number of codewords on that row which were determined to have an error during their respective ECS operation. The pRECS information may be an optional feature which may be enabled or disabled by the client. For example, a mode register may include a per-row ECS (pRECS) enable value. When the pRECS enable value is active, the memory may collect and store prECS information. When the pRECS enable value is inactive, the memory may skip collecting such information.

The memory may store the per-row scrub information along each row. Certain memory cells along each row may be set aside to store the pRECS information for that row. For example, the columns along a given row may be specified by a column select signal, with sets of bit lines sharing a common column select signal value. One column select signal may be used to activate the memory cells used to store the per-row scrub information along each row. For example, a mode register may store a pRECS-CS value, which may designate the value of the C'S signal set aside for pRECS information storage.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The CIA terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, a codeword including read data and read parity bits is read from memory cells in the memory array 118 corresponding to the row address and column address. The read command is received by the command decoder 106, which provides internal commands so that read data from the memory array 118 is provided to the ECC control circuit 120. The ECC control circuit 120 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output to outside the device 100 from the data terminals DQ via the input/output circuit 122.

The device 100 may receive an access command which is a write command. When the write command is received, and a bank address, a row address, and a column address are timely supplied as part of the write operation, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided as a codeword to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a codeword which includes a certain number of data bits and a certain number of parity bits (e.g., 128 data bits and 8 parity bits). The data bits may be provided from either from the IO circuit 122 or the memory array 118 depending on if it is a read or write operation, and the ECC control circuit 120 uses the parity bits to locate and correct potential errors in the codeword. For example, as part of a write operation an ECC control circuit 120 may receive 128 bits of data from the IO circuit 122 and may generate 8 parity bits based on those 128 data bits to form a codeword with 136 total bits. The codeword may be written to the memory array 118. As part of an example read operation, the ECC control circuit 120 may receive a codeword with 128 data bits and 8 parity bits from the memory cell array 118. The ECC control circuit 120 may generate new parity bits from the 128 data bits, and then compare the new parity bits to the read parity bits in the codeword to generate syndrome bits. The syndrome bits may be used to locate errors in the codeword and the ECC control circuit 120 and may correct them if any are found before supplying the data bits to the IO circuit 122. While various embodiments may be discussed with reference to ECC circuits which use codewords where 8 parity bits are used to find one error in 128 data bits, it should be understood that these are for explanatory purposes only, and that other numbers of data bits, error bits, and parity bits may be used in other example embodiments.

During a read operation, the ECC control circuit 120 checks the codeword and locates and corrects any errors before providing the corrected codeword to the IO circuit 122. Accordingly, if there was an error, it may remain in the codeword stored in the memory array 118 since the correction is made between the memory array 118 and the IO circuit 122. The memory device 100 includes error check and scrub (ECS) logic 130, which is used to correct errors stored within the memory array 118. Over the course of an ECS cycle, the ECS circuit 130 generates a sequence of addresses (e.g., a sequence of row addresses and a sequence of column addresses), which cover all the codewords stored in the memory array 118. For each address in the sequence, the ECS circuit 130 operates the address decoder 104 and command decoder 106 to perform a read operation on the memory cells of that address, and then instead of providing the corrected codeword off the device 100 as in a normal read, the corrected codeword is written back to the memory array 118. In some embodiments, only a portion of the codeword (e.g., only the data bits or only the data bit changed by the correction) may be written back to overwrite the previous codeword. By cycling through a sequence of addresses which includes all codewords, the ECS circuit 130 may perform an ECS cycle to repair the errors in the memory cells array 118.

The ECS circuit 130 may perform an ECS cycle based on a manual or auto mode. In a manual mode, the ECS circuit 130 may receive a command (e.g., a multi-purpose command or MPC) and may perform an ECS operation responsive to that command. In an auto mode, the ECS circuit 130 may use internal logic and timing to carry out ECS operation. For example, the ECS circuit 130 may perform ECS operations during refresh operations. The ECS circuit 130 may have a specified time over which to complete the sequence of addresses (e.g., to perform the ECS cycle). For example, the memory device 100 may specify 12, 24, or 48 hours to complete a sequence of ECS operations which includes all codewords in the memory array 118. The ECS circuit 130 may perform a read, correct, and write ECS operation on each address in the sequence such that the sequence is completed over the course of the specified period. Accordingly, the average timing between individual ECS operations may be specified by the total number of codewords in the memory array 118 and the length of time in which the ECS cycle should be performed.

The ECS circuit 130 collects information about the errors which are located. The memory 100 may record per-row ECS information when a per-row ECS mode is enabled. The per-row ECS mode may be enabled by a setting in the mode register 132. For example, each row of the memory array 118 may include a number of code words. When the pRECS mode is enabled, the ECS circuit 130 may generate a count for each row which indicates how many codewords on that row included an error during the most recent ECS cycle. For example, the ECS circuit 130 may include a per-row ECS register. During the ECS cycle, the ECS circuit 130 may generate a row address, and then perform an ECS operation on each codeword of that row address (e.g., by generating column addresses in sequence) before moving on to a next row. During that process, if an error is detected and a pRECS mode is enabled, the value in the per-row ECS register may be updated (e.g., incremented). Once all the codewords along the current row are checked (e.g., when the column address wraps back around to an initial value), the value in the per-row ECS register may be stored, and the per-row ECS register reset to an initial value (e.g., 0).

In some embodiments, there may be multiple per-row ECS registers, such as a per-row ECS register for each bank. Multiple pre-row ECS registers may be used because ECS operations may be dispersed between different banks (e.g., an ECS operation in a first bank may be followed by an ECS operation in a second bank before a second ECS operation in the first bank occurs). Accordingly, each per-row ECS register may track a number of errors along a current row for each bank.

In some embodiments, the ECS circuit 130 may store the per-row ECS information on the row associated with that per-row ECS information. For example, a set of memory cells along the row may be set aside to be used as storage for per-row ECS information. In some embodiments, which memory cells are set aside may be a setting of the mode register 132. For example, a column select (CS) signal value may specify the bit lines which intersect the set aside memory cells along each row, and that value of the CS signal may be stored in the mode register 132. Other methods of designating memory cells along the rows to store the pRECS information may be used in other examples. A controller of the memory 100 may use read operations to retrieve the per-row ECS information from one or more rows.

In some embodiments, the memory 100 may also generate overall ECS information such as overall readouts. For example, the ECS circuit 130 may store overall ECS information in a mode register 132, so that a controller of the memory device 100 may retrieve readout information about errors in the memory device 100. For example, the ECS circuit 130 may change (e.g., increment) an error count (EC) count value each time a codeword with an error is detected. In some embodiments, the error count (EC) may be changed responsive to each row which includes one or more codeword errors. Whether the EC value represents total codewords or rows with at least one codeword error may be setting of the memory 100 (e.g., based on a setting in the mode register 132) and may be changed between ECS cycles. When all addresses in the sequence are complete, the ECS circuit 130 may write this count value to the mode register 132. In some embodiments, the ECS circuit 130 may only write the count value to the mode register 132 if the EC count value exceeds a threshold filter. In some embodiments, an EC register of the mode register 132 may not store the exact EC count value, but may instead specify a range of the EC count value. For example, a first state of the EC register may indicate that the EC count value was below the threshold, a second state of the EC register may indicate that the EC count value was between the threshold and a second threshold, a third value may indicate the EC count value was within the range of the second threshold and a third threshold, etc.

Another example overall readout the ECS circuit 130 may generate is errors per row counter (EpRC). This readout may be generated instead of or in addition to the EC readout. As the ECS circuit proceeds, it may generate a row address, and then cycle through column addresses for that row, with each column address specifying one of a number of codewords along the row. The ECS circuit 130 may have an EpRC counter which tracks the maximum number of codewords with errors which are located on a single row address as well as the row address of the row with the maximum number of errors. Once the sequence of addresses is completed, the ECS circuit 130 may write the number of errors and the row address to the ECS register of the mode register 132 if the EpRC count is greater than a threshold filter. The threshold filter for the EpRC register may be different than the threshold filter for the ECS register. In some embodiments, the filters may be settings of the memory. The EpRC count may be distinct from the per-row ECS information, in that the EpRC may only reflect the count of errors for a single row which has the most codeword errors, while the per-row ECS information tracks the number of detected codeword errors on every row of the memory array 118.

The overall ECS readouts, such as the EpRC and ECS counts, may be enabled separately from the pRECS information. For example, the mode register may include an overall ECS enable register which enables the memory to record overall ECS information and a pRECS enable register which allows the The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPER1, and the like based on the power supply potentials VDD and VSS supplied to the power supply terminals. The internal potential VPP is mainly used in the row decoder 108, the internal potentials VOD and VARY are mainly used in the sense amplifiers SA MP included in the memory array 118, and the internal potential VPER1 is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
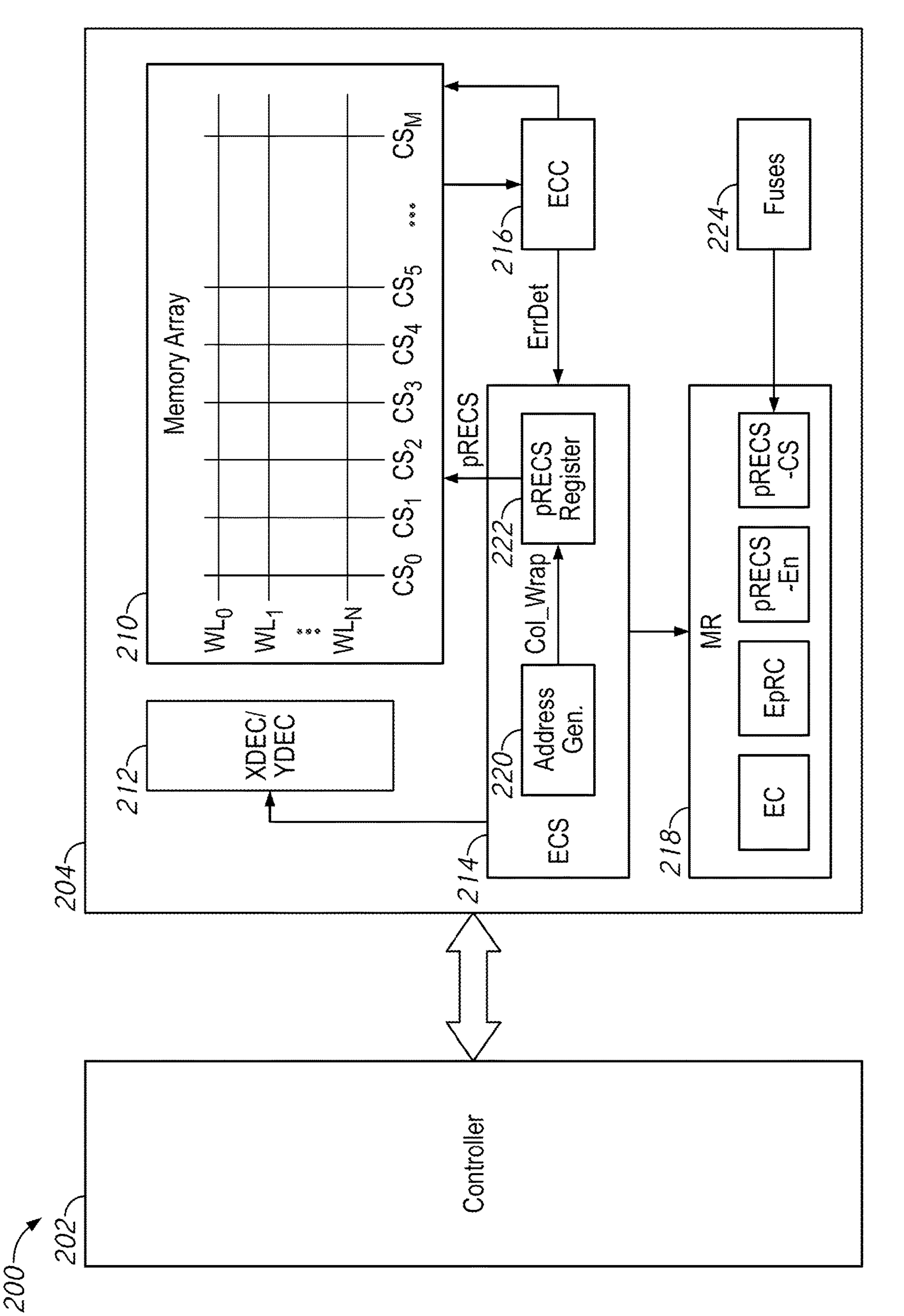
FIG. 2 is a block diagram of a memory system according to some embodiments of the present disclosure.

FIG. 2 is a block diagram of a memory system according to some embodiments of the present disclosure. The system 200 includes a controller 202 and a memory 204. The memory 204 may, in some embodiments, implement the memory device 100 of FIG. 1. The memory system 200 illustrates a memory which generates and store per-row ECS information and an example controller (optional) which may be used to retrieve the per-row ECS information.

The memory 204 includes an ECS circuit 214 which manages ECS operations. The ECS circuit 214 includes an address generator 220 which over the course of an ECS cycle generates addresses for each code word in the memory array 210. For example, the ECS circuit 214 may provide a row and column address (an ECS address), and then update (e.g., increment) the column address, and continue until all column addresses along the row have been provided (e.g., the column address wraps back to an initial value), the ECS circuit 214 may then update (e.g., increment) the row address and repeat the process. The ECS circuit may continue generating ECS addresses until addresses associated with all codewords have been provided over the course of an ECS cycle. The current ECS address may be provided to row and column decoders 212, along with commands (such as read-modify-write commands, not shown) such that for each address, the codeword associated with the current address is read out to the ECC circuit 216, corrected (if necessary), and the corrected codeword written back to the location specified by the current address. The ECS address may then be updated.

The ECC circuit 216 may provide an error detected signal ErrDet to the ECS circuit 214. The signal ErrDet may be active each time the ECC circuit 216 detects an error in the codeword read from the memory array 210 as part of an ECS operation. The ECS circuit includes one or more counters which are updated (e.g., incremented) responsive to the ErrDet signal. For example, an EC counter may be updated based on each time the ErrDet signal is active, while the EpRC counter may also take into account the current address being provided by the ECS circuit 214 in order to identify the row which includes the most errors (and how many errors were on that row). If a counter exceeds a threshold value at the end of an ECS cycle, then the ECS circuit 214 may write information based on the count value to the mode register 218. The different values tracked by the ECS circuit 214 may have different thresholds (e.g., an EC threshold and an EpRC threshold). The thresholds may be settings of the memory (e.g., fuse settings and/or mode register settings) and may be set based on customer requirements.

The ECS circuit 214 also includes a per-row ECS (pRECS) register 222. When an pRECS mode is enabled, the pRECS register 222 may change (e.g., increment) a stored count value each time the ErrDet signal is active, and reset to an initial value (e.g., 0) each time the address generator 220 indicates that a column address has wrapped back to a new value (e.g., each time a final column address along a row has been provided). For example, after the final column address has been generated, the address generator 220 may provide a column wrap signal Col_Wrap, and update the row address to a new value. Responsive to the signal Col_Wrap, the pRECS register 222 may write its current value to memory cells of the memory array 210 and reset the stored count value (e.g., to 0). For example, the count value in the pRECS register 222 may be written to memory cells along the current row (e.g., before the row address is updated responsive to Col_Wrap). In this manner, the pRECS value for each row may represent a number of codewords along that row which contained an error (e.g., a number of times ErrDet was active for each value of the row address portion of the ECS address). In some embodiments, there may be a pRECS register 222 for each bank, and each bank may separately generate row and column addresses for ECS operations.

The memory array 210 may be organized in rows and columns. Each row may be specified by a row address (e.g., XADD) which specifies a word line. For example, the address generator 220 may generate a first row address XADD, and responsive to that, the row decoder 212 may activate a first word line (e.g., $WL_0$) of the memory array 210. The columns along the activated row are accessed by a column address, which is decoded to activated column select signals CS. While each column select signal is shown with a single bit line, each CS signal may activate multiple individual bit lines. For example, a given CS signal may activate 8 bit lines in each of 17 column planes of the memory array, for a total of 136 active bit lines, and 136 bits (128 data bits and 8 parity bits). Accordingly, the address generator 220 may generate a row address, then as part of a first ECS operation provide a first column select signal, then as part of a second ECS operation provide a second column select signal and so forth.

In some embodiments, the per-row ECS information may be saved in the memory array 210. In some embodiments, the per-row ECS information may be saved in memory cells along the row which the per-row ECS information is associated with. For example, one or more values of the column select signal (and their corresponding memory cells) may be set aside for storing per-row ECS information. The mode register 218 may be used to designate a value pRECS-CS, a value of the CS signal set aside for per-row ECS information. When the address generator 220 is generating ECS addresses, the address in pRECS-CS may be skipped, since it does not contain a codeword with correctable data. For example, if pRECS-CS designates a column select value $CS_M$, then the address generator 220 may set a row address and provide column addresses $CS_0$ to $CS_{M-1}$, but not provide $CS_M$. The address generator 220 may then provide the signal Col_Wrap when the column address is updated as it may return to a value of $CS_0$. Responsive to the signal Col_Wrap, the ECS logic 214 may provide the value of the pRECS register 222 as data along with the row address and the column address which activates the value in the pRECS-CS (e.g., $CS_M$) and a write command to write the value in the pRECS register 222 to the memory cells accessed by the value in the pRECS-CS register.

The mode register 218 may store various values which are related to the ECS operation. For example, the present disclosure describes an EC register and an EpRC register, although different, more, or fewer registers are possible in other examples. Each register may store various values associated with a respective counter in the ECS circuit 214. For example, the EC register may represent a number of codewords with errors which were detected in the previous ECS cycle. The EC register may represent a raw count value, or may represent a range in which the count value falls. For example, a first value of the EC register may represent that the count is below the threshold, a second value of the EC register may represent that the count is between the threshold and a first count value, a third value of the EC register may represent that the count is between the first count value and a second count value etc. The EpRC register may store both a count value and a row address associated with the row which contained the most codeword errors.

The mode register 218 includes a per-row ECS enable register pRECS-En. The register pRECS-En stores a value which indicates if the pRECS mode is enabled for the memory 204. If the pRECS-En register stores an inactive pRECS-En value, then the pRECS mode may be disabled, and the memory 204 may not collect pRECS information. For example, the pRECS register 222 may not respond to the ErrDet signal. In some embodiments, even the pRECS register 222 contains an inactive value, other ECS information, such as EC and EpRC may still be collected. In some embodiments, different ECS information as well as the ECS functionality may be separately enabled by one or more respective registers (not shown) of the mode register 218. In some embodiments, a controller 202 may set a value in the pRECS-En register to determine if pRECS information is collected or not. In some embodiments, the value of pRECS-En may be a memory 204 setting (e.g., programmed in a fuse array 224) which may have a value which is independent of the controller 202.

The mode register 218 may also include a pRECS address register, pRECS-CS, which specifies which memory cells are used to store the per-row ECS information. For example, the pRECS-CS register may store a value of the CS signal which specifies memory cells which have been designated for use for storing pRECS. Other information used for designating memory cells may be used in other example embodiments. In some embodiments, the pRECS-CS may store a value which is programmed in the fuse array 224. For example, the pRECS-CS value may be programmed into the fuse array 224 and then loaded into the pRECS-CS register of the mode register 218. In this way, once programmed the pRECS address may be programmed into the memory 204 in a manner which is a permanent setting of the memory 204.

The controller 202 may retrieve the per-row ECS information by performing a read operation on the memory cells used to store the per-row ECS information. For example, the controller 202 may retrieve the address stored in pRECS-CS (e.g., by performing a mode register read operation on that register) and then perform a read operation on those memory cells along a row to retrieve that row's per-row ECS information. In some embodiments, the pRECS-CS value may block non-ECS access to those memory cells. For example, the controller 202 may read the pRECS-CS value and then block write operations to those memory cells (as that would overwrite the pRECS information). In some embodiments, the memory 204 may prevent externally received write operations from being performed on the address(es) designated by pRECS-CS. In some embodiments, non-ECS access to the designated memory cells may only be blocked when the value pRECS-En is active.

Figure 3:
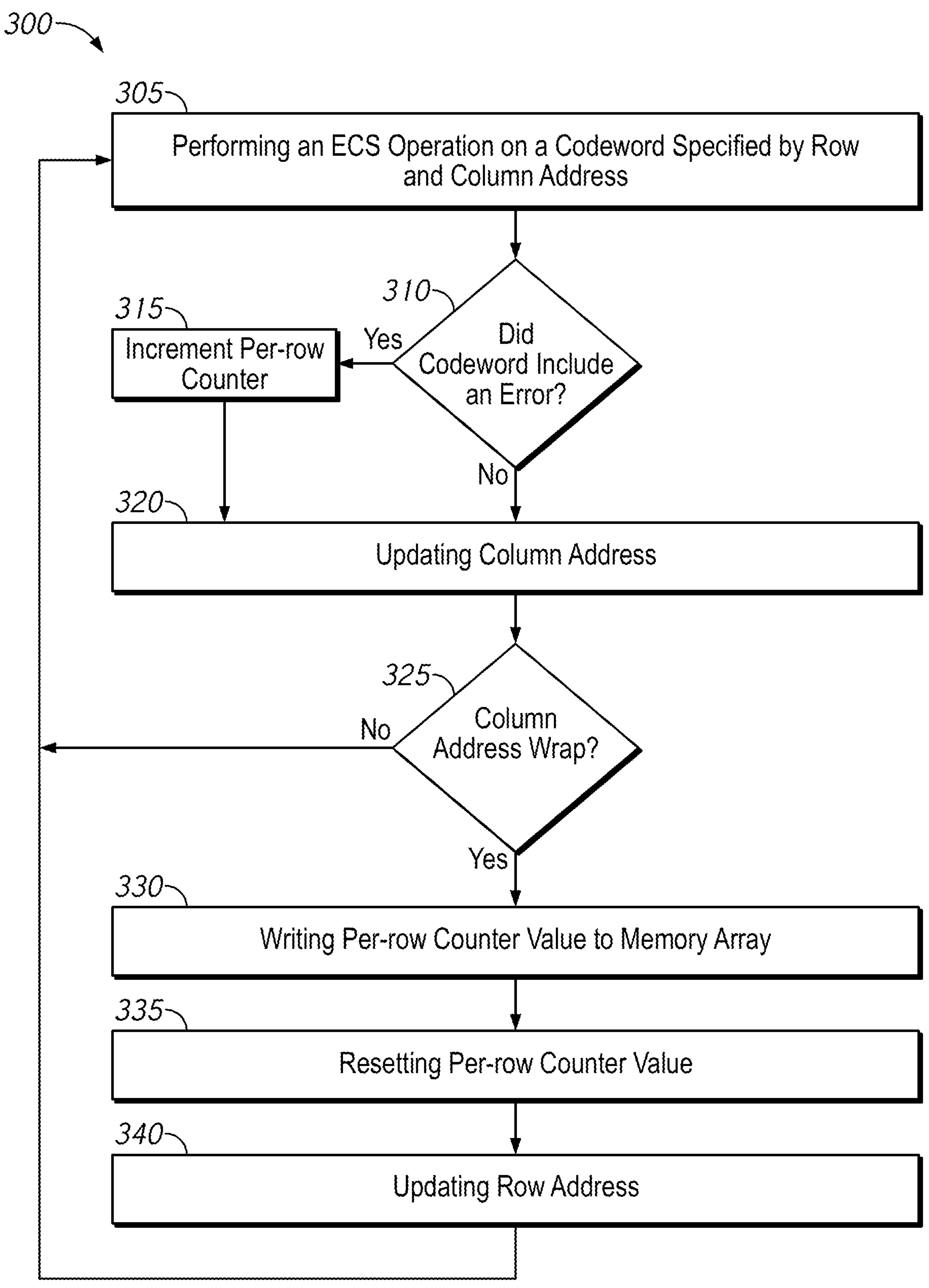
FIG. 3 is a flow chart of a method according to some embodiments of the present disclosure.

FIG. 3 is a flow chart of a method according to some embodiments of the present disclosure. The method 300 may, in some embodiments, be implemented by one or more of the systems or apparatuses described herein, such as the memory 100 of FIGS. 1 and/or 204 of FIG. 2. The method 300 may represent a process which is carried out as part of an ECS cycle.

The method 300 includes box 305, which describes performing an ECS operation on a codeword specified by a row and column address. For example, an ECS logic circuit (e.g., 214 of FIG. 2) may provide the row and column address to respective row and column decoders (e.g., 212 of FIG. 2) along with command signals which indicate an ECS operation, such as a read-modify-write command. The method 300 includes reading the codeword from the memory cells specified by the row and column address to an ECC circuit (e.g., 216 of FIG. 2). The method 300 includes determining if the codeword includes errors, correcting those errors, and then writing the corrected codeword back to the memory cells specified by the row and column address.

The method 300 includes box 310, which describes determining if the codeword included an error. For example, the ECC circuit may activate an error detected signal (e.g., ErrDet of FIG. 2) to indicate that the codeword read in box 305 included an error (e.g., before that error was corrected and the corrected codeword written back). If the codeword included an error (e.g., if ErrDet is active), then the method 300 may proceed to box 315, which describes incrementing a per-row counter. In some embodiments, there may be a per-row counter for each bank of the memory, and the method 300 may also include specifying memory cells with a bank address. In such embodiments, the box 315 may include determining which per-row ECS counter to increment based on the bank address. After box 315 the method 300 may proceed to box 320. If during box 310 it is determined that the codeword did not contain an error, than the method may proceed to box 320 without incrementing the per-row counter.

Box 320 describes updating a column address. For example, the column address may be incremented to generate a new column address. Box 320 may be followed by box 325, which describes determining if the update caused the column address to 'wrap'. For example, if by incrementing the column address, the value of the column address 'rolled over' to an initial value. The wrapping of the column address may indicate that a final column address was reached and that the update column address is an initial column address. The final column address may indicate a final column address along the row which specifies an addressable codeword. Some column addresses may be 'stranded' (e.g., not used for addressable memory) or otherwise skipped such that a final address may be reached without necessarily generating every possible value of the column address. If the column address did not wrap, then the method 300 may return to box 305. If the column address did wrap, then the method 300 may proceed to box 330.

Box 330 describes writing the per-row counter value to the memory array. For example, the per-row counter value may be provided to the memory array as data to be written along with a row and column address and a write command. In some embodiments, the per-row counter value may be saved on the same row that the per-row counter value refers to. For example, the row address may be the same row address as used in box 305. The column address may refer to columns which are set aside or otherwise reserved for storing the per-row counter information. For example, a mode register such as pRECS-CS may specify which columns to use. The method 300 may include writing the per-row count value to overwrite a previous per-row count value (e.g., from a previous ECS cycle).

Box 330 may be followed by box 335, which describes resetting the per-row counter value. For example the per-row counter may be reset to an initial value (e.g., 0). In embodiments where there are different per-row counters for each bank, the box 335 may describe resetting the per-row count value associated with the bank where an ECS operation (e.g., box 305) was just performed.

Box 335 may generally be followed by box 340 which describes updating the row address. If the column address wrapped, then that may indicate that all codewords along a row have been tested as part of an ECS operation (e.g., as part of box 305). Accordingly, the row address may be updated so that the codewords along a new row. In some embodiments, the row address may be updated by incrementing the previous row address. After box 340, the method may generally return to box 305.

The boxes shown as part of the method 300 represents steps which happen as part of an ECS cycle, however individual ECS operations may be separated by time and location in the memory. For example, between ECS operations (e.g., between times that box 305 is performed) the memory may perform various other operations such as refresh operations, access operations, etc. Similarly, the method 300 may include performing ECS operations on different banks at different times. For example, the method 300 may include performing a first ECS operation (e.g., starting with box 305) on a first bank and if an error is detected updating a first per-row counter associated with that bank, then performing a second ECS operation on a second bank and if an error is detected updating a second per-row ECS counter before returning to perform a third ECS operation on the first bank.

In some embodiments, the method 300 may begin with determining if a per-row ECS mode is enabled or not (e.g., by checking a value of the pRECS-En register). If the pRECS mode is note enabled, the steps 315 and 330 to 340 may be skipped.

FIG. 4 is a flow chart of a method according to some embodiments of the present disclosure. The method 400 may, in some embodiments, be implemented by a memory such as the memory 100 of FIGS. 1 and/or 204 of FIG. 2.

The method 400 includes box 410, which describes enabling a per-row ECS (pRECS) mode based on a pRECS enable setting in a mode register. For example, a mode register (e.g., 132 of FIG. 1 and/or 218 of FIG. 2) includes a pRECS enable setting (e.g., pRECS-En of FIG. 2). If the pRECS enable setting is active (e.g., at a high logical level) then a pRECS enable signal may be provided from the mode register to ECS logic (e.g., 130 of FIGS. 1 and/or 214 of FIG. 2) at an active level. If the pRECS enable signal is at the active level, then the ECS logic may enable a pRECS mode. If the pRECS enable signal is inactive (e.g., because the pRECS enable setting is inactive), then the pRECS mode may not be enabled. The method 400 may include setting a value of the pRECS enable setting in the mode register with a controller (e.g., 202 of FIG. 2) of the memory.

The method 400 includes box 420, which describes counting a number of codewords which include errors along each row when the pRECS mode is enabled to generate a plurality of per-row ECS counts, each associated with a respective one of a plurality of rows of a memory array. For example, when the pRECS mode is enabled, the method 400 may include one or more of the steps described with respect to FIG. 3.

The method 400 may include generating overall ECS information even if the pRECS mode is disabled. For example, the method 400 may include collecting an overall ECS error count (e.g., EC of FIG. 2) and/or a row address and count associated with a maximum number of codeword errors on a single row (e.g., EpRC of FIG. 2) regardless of whether the pRECS mode is enabled or not.

In some embodiments, the method 400 may include storing the plurality of per-row ECS counts in the memory array at a location specified by a per-row ECS address (e.g., pRECS-CS) in the mode register. The method 400 may include storing each of the plurality of per-row ECS counts along memory cells of the associated respective one of the plurality of rows. For example, the pRECS address may specify a value of a column select signal, and the method 400 may include writing the value of a pRECS register (e.g., 222 of FIG. 2) to memory cells along the associated row which are activated by the specified column select signal. The pRECS address may be loaded into the mode register based on fuse settings of the memory.

FIG. 5 is a flow chart of a method according to some embodiments of the present disclosure. The method 500 may, in some embodiments, be performed by a controller (e.g., 202 of FIG. 2) which is external to a memory device (e.g., 100 of FIGS. 1 and/or 204 of FIG. 2).

The method 500 includes box 510, which describes reading a per-row error correct and scrub (ECS) column address from a mode register of a memory. The controller may perform a mode register read operation to retrieve a per-row ECS (pRECS) address (e.g., the pRECS-CS address of FIG. 2). The pRECS column address may be loaded into the mode register based on fuse settings of the memory (e.g., information programmed in a fuse array of the memory). The pRECS column address may be a column address or a portion of a column address, or may be a decoded column address signal, such as a column select signal.

The method 500 includes box 520, which describes performing a read operation on a selected row and the per-row ECS column address to retrieve per-row ECS information related to the selected row. For example, the method 500 may include the controller providing a row address based on the selected row, a column address based on the pRECS column address, and a read command to CIA terminals of the memory. The method 500 may include receiving the pRECS information along data terminals of the memory.

The method 500 may also include preventing external write operations to the per-row ECS column address. The method 500 may also include performing a second read operation on a second selected row and the per-row ECS column address to retrieve per-row ECS information related to the second row. The method 500 may also include enabling a pRECS mode of the memory, for example by performing a mode register write operation to enable a pRECS enable register (e.g., pRECS-En of FIG. 2).

In some embodiments, the pRECS information may be stored in memory cells which are 'stranded', not otherwise used to store information provided by the controller. For example, some memories may store data as well as metadata associated with that data. As part of an example write operation, a controller (e.g., 202 of FIG. 2) may provide the data and its associated metadata to the memory (e.g., 204 of FIG. 2) along with row, column, and bank addresses for where to store the data. The memory may set aside some columns along each row for data, and some columns for metadata. The metadata columns may not be directly accessible by the controller. Instead, the memory may use internal mapping to determine where to store the metadata based on which columns are being used to store the data. However, in some implementations, the total number of columns (e.g., the total number of memory cells) along a row may not divide evenly between columns for data storage and columns reserved for metadata. In other words, some column addresses (e.g., a first portion of the memory cells along the row) may be used for data storage, some columns (e.g., a second portion of the memory cells along the row) may be used for metadata, and some columns (e.g., a third portion of the memory cells along the row) may be 'stranded', neither used for data nor metadata. In such an embodiment, the memory may use the stranded columns to store the pRECS information. The pRECS address register (e.g., pRECS-CS of FIG. 2) may designate which columns are stranded, and may be based on the memory's mapping of data and metadata column addresses.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus, comprising:

a memory array comprising a first plurality of memory cells at the intersection of a first word line and a plurality of bit lines and a second plurality of memory cells at the intersection of a second word line and the plurality of bit lines, wherein a first plurality of codewords are stored in at least some of the first plurality of memory cells and a second plurality of codewords are stored in at least some of the second plurality of memory cells;

a mode register configured to store a per-row error correct and scrub (ECS) count enable signal; and ECS logic configured to:

count a first number of the first plurality of codewords along the first word line which contain an error when the per-row ECS count enable signal is active;

count a second number of the second plurality of codewords along the second word line which contain an error when the per-row ECS count enable signal is active;

collect other ECS information, the other ECS information including a third number of the first plurality of codewords and the second plurality of codewords which include errors regardless of whether the per-row ECS count enable signal is active or not, the other ECS information comprising at least one of an error count (EC) count value or an errors per row count (EpRC) count value; and store the first number in the memory array.

2. The apparatus of claim 1, wherein:

a first portion of the first plurality of memory cells is used to store data;

a second portion of the first plurality of memory cells is used to store metadata associated with the data;

a third portion of the first plurality of memory cells is used neither for data or metadata; and the ECS logic is configured to store the first number in the third portion.

3. The apparatus of claim 2, wherein the mode register also includes a per-row ECS address which specifies selected ones of the first plurality of memory cells used to store the first number.

4. The apparatus of claim 3, wherein the per-row ECS address specifies a column address signal associated with selected ones of the plurality of bit lines.

5. The apparatus of claim 3, further comprising a fuse array configured to store the per-row ECS address which is loaded into the mode register.

6. The apparatus of claim 1, wherein the ECS logic is configured to store the first number and the second number in the memory array.

7. The apparatus of claim 1, wherein the EC count value represents total codewords or rows with at least one codeword error, and wherein the EpRC count value represents a maximum number of codewords with errors which are located on a single row address and the row address of the row with the maximum number of errors.

8. An apparatus, comprising:

a memory array comprising a first plurality of memory cells at the intersection of a first word line and a plurality of bit lines and a second plurality of memory cells at the intersection of a second word line and the plurality of bit lines, wherein a first plurality of codewords is stored in at least some of the first plurality of memory cells and a second plurality of codewords is stored in at least some of the second plurality of memory cells;

a mode register configured to store a per-row error correct and scrub (ECS) count enable signal; and ECS logic configured to:

count a first number of the first plurality of codewords along the first word line which contain an error when the per-row ECS count enable signal is active;

count a second number of the second plurality of codewords along the second word line which contain an error when the per-row ECS count enable signal is active; and store the first number in one or more stranded columns of the memory array, wherein the one or more stranded columns are configured as non-addressable memory in at least a mode of the apparatus.

9. The apparatus of claim 8, wherein:

a first portion of the plurality of memory cells is used to store data;

a second portion of the plurality of memory cells is used to store metadata associated with the data;

a third portion of the plurality of memory cells is used neither for data or metadata; and the ECS logic is configured to store the first number in the third portion.

10. The apparatus of claim 8, wherein the ECS logic is configured to collect other ECS information regardless of whether the per-row ECS count enable signal is active or not, the other ECS information comprising at least one of an error count (EC) count or an errors per row count (EpRC) count.

11. An apparatus, comprising:

a memory array comprising a first plurality of memory cells at the intersection of a first word line and a plurality of bit lines and a second plurality of memory cells at the intersection of a second word line and the plurality of bit lines, wherein a first plurality of codewords is stored in at least some of the first plurality of memory cells and a second plurality of codewords is stored in at least some of the second plurality of memory cells;

a mode register configured to store a per-row error correct and scrub (ECS) count enable signal; and ECS logic configured to:

count a first number of the first plurality of codewords along the first word line which contain an error when the per-row ECS count enable signal is active;

count a second number of the second plurality of codewords along the second word line which contain an error when the per-row ECS count enable signal is active; and store the first number in the memory array, wherein:

a first portion of the plurality of memory cells is used to store data;

a second portion of the plurality of memory cells is used to store metadata associated with the data;

a third portion of the plurality of memory cells is used neither for data or metadata; and the ECS logic is configured to store the first number in the third portion, wherein the mode register is configured to store a per-row ECS address that specifies selected ones of the plurality of memory cells used to store the first number.

12. The apparatus of claim 11, wherein the per-row ECS address specifies a column address signal associated with selected ones of the plurality of bit lines.

13. The apparatus of claim 11, further comprising a fuse array configured to store the per-row ECS address which is loaded into the mode register.

14. An apparatus, comprising:

a memory array comprising a first plurality of memory cells at the intersection of a first word line and a plurality of bit lines and a second plurality of memory cells at the intersection of a second word line and the plurality of bit lines, wherein a first plurality of codewords is stored in at least some of the first plurality of memory cells and a second plurality of codewords is stored in at least some of the second plurality of memory cells;

a mode register configured to store a per-row error correct and scrub (ECS) count enable signal; and ECS logic configured to:

count a first number of the first plurality of codewords along the first word line which contain an error when the per-row ECS count enable signal is active; and count a second number of the second plurality of codewords along the second word line which contain an error when the per-row ECS count enable signal is active, wherein:

a first portion of the first plurality of memory cells is used to store data;

a second portion of the first plurality of memory cells is used to store metadata associated with the data;

a third portion of the first plurality of memory cells is used neither for data or metadata, and the ECS logic is configured to store the first number in the third portion.

15. The apparatus of claim 14, wherein:

a fourth portion of the second plurality of memory cells is used to store data;

a fifth portion of the second plurality of memory cells is used to store metadata associated with the data;

a sixth portion of the second plurality of memory cells is used neither for data or metadata; and the ECS logic is configured to store the second number in the sixth portion.

16. The apparatus of claim 14, wherein:

the mode register is configured to store a per-row ECS address that specifies selected ones of the first plurality of memory cells used to store the first number; and the per-row ECS address specifies a column address signal associated with selected ones of the plurality of bit lines.

17. The apparatus of claim 16, further comprising a fuse array configured to store the per-row ECS address that is loaded into the mode register.

18. The apparatus of claim 14, wherein the ECS logic is configured to collect other ECS information regardless of whether the per-row ECS count enable signal is active or not, the other ECS information comprising at least one of an error count (EC) count or an errors per count (EpRC) count.

19. An apparatus, comprising:

a memory array comprising a first plurality of memory cells at the intersection of a first word line and a plurality of bit lines and a second plurality of memory cells at the intersection of a second word line and the plurality of bit lines, wherein a first plurality of codewords is stored in at least some of the first plurality of memory cells and a second plurality of codewords is stored in at least some of the second plurality of memory cells;

a mode register configured to store a per-row error correct and scrub (ECS) count enable signal; and ECS logic configured to:

count a first number of the first plurality of codewords along the first word line which contain an error when the per-row ECS count enable signal is active;

count a second number of the second plurality of codewords along the second word line which contain an error when the per-row ECS count enable signal is active; and store the first number and the second number in one or more stranded columns of the memory array, wherein the one or more stranded columns are configured as non-addressable memory in at least one mode of the apparatus.

20. The apparatus of claim 19, wherein:

a first portion of the first plurality of memory cells is used to store data;

a second portion of the first plurality of memory cells is used to store metadata associated with the data;

a third portion of the first plurality of memory cells is used neither for data or metadata; and the ECS logic is configured to store the first number in the third portion.

21. The apparatus of claim 19, wherein the ECS logic is configured to collect other ECS information regardless of whether the per-row ECS count enable signal is active or not, the other ECS information comprising at least one of an error count (EC) count or an errors per row count (EpRC) count.

* * * * *